US010090311B1

(12) United States Patent
Guo et al.

(10) Patent No.: US 10,090,311 B1
(45) Date of Patent: Oct. 2, 2018

(54) COST-FREE MTP MEMORY STRUCTURE WITH REDUCED TERMINAL VOLTAGES

(71) Applicant: GLOBALFOUNDRIES Singapore Pte. Ltd., Singapore (SG)

(72) Inventors: Pengfei Guo, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/464,368

(22) Filed: Mar. 21, 2017

(51) Int. Cl.
*H01L 29/423* (2006.01)
*H01L 27/11521* (2017.01)
*H01L 29/10* (2006.01)
*H01L 29/788* (2006.01)
*H01L 29/06* (2006.01)
*H01L 29/66* (2006.01)
*H01L 21/28* (2006.01)

(52) U.S. Cl.
CPC .. *H01L 27/11521* (2013.01); *H01L 21/28273* (2013.01); *H01L 29/0642* (2013.01); *H01L 29/1095* (2013.01); *H01L 29/66825* (2013.01); *H01L 29/7883* (2013.01)

(58) Field of Classification Search
CPC ......... H01L 27/11521; H01L 27/11558; H01L 27/11524; H01L 21/28273; H01L 29/0642; H01L 29/1095; H01L 29/66825; H01L 29/7883; H01L 29/42328; H01L 29/42324; H01L 29/66575; H01L 29/0847; H01L 29/7881; H01L 29/7885; H01L 29/788; H01L 28/40; G11C 16/0433

USPC ........................................................ 257/300
See application file for complete search history.

(56) References Cited

U.S. PATENT DOCUMENTS

| 5,440,159 | A  * | 8/1995  | Larsen ................. H01L 27/115 257/300 |
| 6,072,725 | A  * | 6/2000  | Le .......................... G11C 5/147 365/185.18 |
| 6,822,254 | B1 * | 11/2004 | Lovejoy ................ H01L 27/115 257/30 |
| 6,985,386 | B1 * | 1/2006  | Mirgorodski ...... G11C 16/0416 257/E21.694 |
| 7,020,027 | B1 * | 3/2006  | Poplevine .............. G11C 16/10 365/185.05 |
| 7,042,763 | B1 * | 5/2006  | Mirgorodski ...... G11C 16/0441 365/185.05 |
| 7,471,572 | B1 * | 12/2008 | Bu ......................... G11C 16/14 365/185.22 |
| 9,406,764 | B2 * | 8/2016  | Shum .................. H01L 29/7883 |

(Continued)

*Primary Examiner* — Victoria K Hall
(74) *Attorney, Agent, or Firm* — Horizon IP Pte Ltd

(57) ABSTRACT

Device and methods for forming a single transistor non-volatile (NV) multi-time programmable (MTP) memory cell are disclosed. The disclosed memory cell is derived via the disclosed method that includes providing a substrate and forming at least a transistor well with a second polarity type dopant and first and second capacitor wells with a first polarity type dopant in the substrate. The method also includes forming a transistor having a floating gate over the transistor well, a control gate over the first capacitor well and coupled to the floating gate, an erase gate over the second capacitor well and coupled to the floating gate. The control gate comprises a control capacitor while the erase gate comprises an erase capacitor that is decoupled from the control capacitor.

20 Claims, 11 Drawing Sheets

(56) References Cited

U.S. PATENT DOCUMENTS

| | | | | |
|---|---|---|---|---|
| 9,515,152 B2* | 12/2016 | Guo | ................ | H01L 29/42328 |
| 9,608,081 B2* | 3/2017 | Tan | ................ | H01L 29/42328 |
| 9,818,867 B2* | 11/2017 | Tan | ................ | H01L 29/7835 |
| 9,825,223 B2* | 11/2017 | Toh | ................ | H01L 45/144 |
| 2009/0256183 A1* | 10/2009 | Lin | ................ | H01L 29/1083 |
| | | | | 257/298 |
| 2009/0256184 A1* | 10/2009 | Lin | ................ | H01L 29/1083 |
| | | | | 257/298 |
| 2013/0093012 A1* | 4/2013 | Zhang | ................ | H01L 29/402 |
| | | | | 257/335 |
| 2014/0029354 A1* | 1/2014 | Lusetsky | ............ | H01L 29/7881 |
| | | | | 365/185.27 |
| 2015/0214238 A1* | 7/2015 | Shum | ................ | H01L 29/7883 |
| | | | | 257/300 |
| 2015/0214316 A1* | 7/2015 | Guo | ................ | H01L 29/42328 |
| | | | | 257/300 |
| 2015/0221663 A1* | 8/2015 | Tan | ................ | H01L 29/42324 |
| | | | | 257/300 |

* cited by examiner

US 10,090,311 B1

COST-FREE MTP MEMORY STRUCTURE WITH REDUCED TERMINAL VOLTAGES

BACKGROUND

Non-volatile multi-time programmable (MTP) memories have been introduced for beneficial use in numerous applications where customization is required for both digital and analog designs. These applications include data encryption, reference trimming, manufacturing identification (ID), security ID, and many other applications. Some of the existing approaches to constructing MTP memories tend to suffer from long operation time (e.g., programming or erasing time) per cycle, smaller coupling ratio and/or large cell size. In addition, different voltage values may be required at various terminals to operate conventional MTP memories, leading to excessive terminal voltages. Incorporating MTP memories also typically comes at the expense of some additional processing steps.

Therefore, there is a need to provide a simplified MTP structure that has improved performance, and has a manufacturing process that is compatible with the standard complementary metal-oxide-semiconductor (CMOS) platform.

SUMMARY

Embodiments generally relate to a cost-free MTP structure and methods of forming a memory cell.

In one embodiment, a non-volatile MTP memory cell is disclosed. The memory cell comprises of a substrate and at least a transistor well accommodating a transistor with a floating gate disposed over it. A first and second capacitor wells are disposed in the substrate that constitute to a control well and an erase well respectively. A control gate comprises of a control capacitor is disposed over the control well and coupled to the floating gate. The control gate is a capacitor plate of a control capacitor. An erase gate comprises of an erase capacitor is disposed over the erase well and coupled to the control gate and floating gate. The erase gate comprises a capacitor plate of an erase capacitor, which is decoupled from the control capacitor.

In another embodiment, a method of forming a non-volatile MTP memory cell is disclosed. The method includes providing a substrate and forming at least a transistor well with a second polarity type dopant and first and second capacitor wells with a first polarity type dopant in the substrate. The method also includes forming a transistor having a floating gate over the transistor well, a control gate over the control well and coupled to the floating gate, an erase gate over the erase well and coupled to the control gate and floating gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which.

DETAILED DESCRIPTION

Embodiments of the present disclosure generally relate to semiconductor devices or integrated circuits (ICs). More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs). Incorporating the devices in other applications may also be useful. The devices as will be described may relate to 0.13 µm technology node. The devices described below may also be suitable for other technology nodes.

Figure 1:
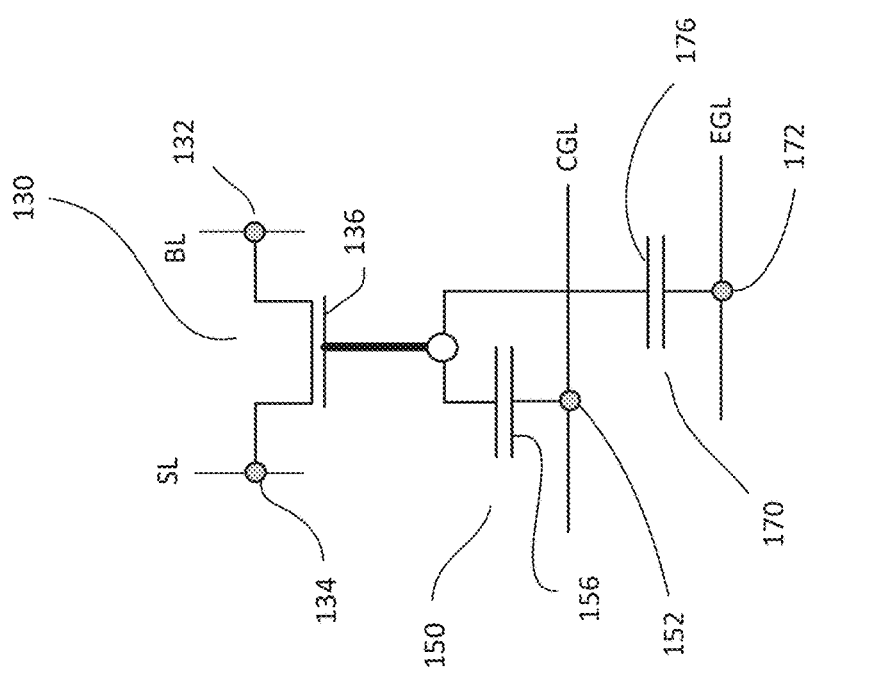
FIG. 1 shows a schematic diagram of an embodiment of a memory cell.

FIG. 1 shows a schematic diagram of a portion of an embodiment of a memory device. The memory device is, for example, a non-volatile memory (NVM) device. Other types of devices may also be useful. The NVM device, in one embodiment, includes a multi-time programmable (MTP) memory cell 100. As shown in FIG. 1, the memory cell 100 includes a transistor 130 coupled to a first capacitor 150 and a second capacitor 170. The transistor is, for example, a metal oxide semiconductor (MOS) transistor. In one embodiment, the transistor functions as a storage element. The transistor 130, for example, serves as a storage transistor.

A transistor includes a gate between first and second source/drain (S/D) regions. For example, the storage transistor 130 includes a first S/D region 132, a second S/D region 134 and a storage gate 136. The S/D regions of a transistor are heavily doped regions with first polarity type dopants. The polarity type determines the type of transistor. For example, the first polarity type may be n-type for a n-type transistor or p-type for a p-type transistor. A gate includes a gate electrode and a gate dielectric. The storage gate 136 may be referred to as a floating gate.

In one embodiment, the first and second capacitors 150 and 170 are MOS capacitors. A MOS capacitor, for example, includes a gate with a gate electrode and a gate dielectric. The first capacitor 150 is a voltage coupling (or control) capacitor while the second capacitor 170 is an erase capacitor. The control capacitor includes a control gate 156 and the erase capacitor includes an erase gate 176.

The control gate 156 forms the control capacitor 150. The control capacitor serves as the program terminal of the memory cell. The control capacitor includes first and second control capacitor plates separated by a dielectric layer. The control gate electrode, for example, serves as the first control capacitor plate while a control well 250 which will be described later serves as the second control capacitor plate. For example, a control gate dielectric layer disposed over the second control capacitor plate separates the first and second control capacitor plates. At least one control contact region 152 is disposed adjacent to the control gate. The control contact region is a heavily doped region. For example, the control contact region is heavily doped with capacitor type dopants. The control contact region 152 serves as a contact region to the control well. In one embodiment, the control gate 156 is coupled to the storage gate 136. For example, the gates are formed from a common gate conductor.

The erase gate 176 forms the erase capacitor 170. The erase capacitor serves as the erase terminal of the memory cell. The erase capacitor includes first and second erase capacitor plates separated by a gate dielectric layer. The erase gate electrode, for example, serves as the first erase capacitor plate while an erase well 260 which will be described later serves as the second erase capacitor plate. For example, an erase gate dielectric layer disposed over the second erase capacitor plate separates the first and second erase capacitor plates. At least one erase contact region 172 is disposed adjacent to the erase gate. The erase contact region is a heavily doped region. For example, the erase region is heavily doped with capacitor type dopants to minimize contact resistance. The erase contact region 172 serves as a contact region to the erase well. In one embodiment, the erase gate 176 is coupled to the storage gate 136. For example, the gates are formed from a common gate conductor.

In one embodiment, the control and erase gates are commonly coupled to the storage gate. For example, the control and erase capacitors isolate the storage gate, making it a floating gate. Other configurations of the storage, erase and control gates may also be useful. In one embodiment, a common gate conductor couples the erase and control gates to the storage gate. For example, the same gate layers (i.e. gate dielectric and gate electrode layers) form the control gate 156, storage gate 136 and erase gate 176. In one embodiment, the same gate dielectric layer used for the storage, erase and control gates includes a thickness suitable for medium voltage devices. Other suitable gate dielectric thicknesses may also be useful.

The first S/D region 132 of the storage transistor 130 is coupled to a bit line (BL) of the memory device while the second S/D region 134 of the storage transistor is coupled to a source line (SL) of the memory device. The control contact region 152 is coupled to a control gate line (CGL) of the memory device and the erase contact region 172 is coupled to an erase gate line (EGL) of the memory device. In one embodiment, the CGL and EGL are disposed along a first direction, such as a wordline direction, while the SL and BL are disposed along a second direction, such as the bitline direction. The first and second directions, for example, are orthogonal to each other. Other configurations of BL, SL, CGL and EGL may also be useful.

Figure 2A:
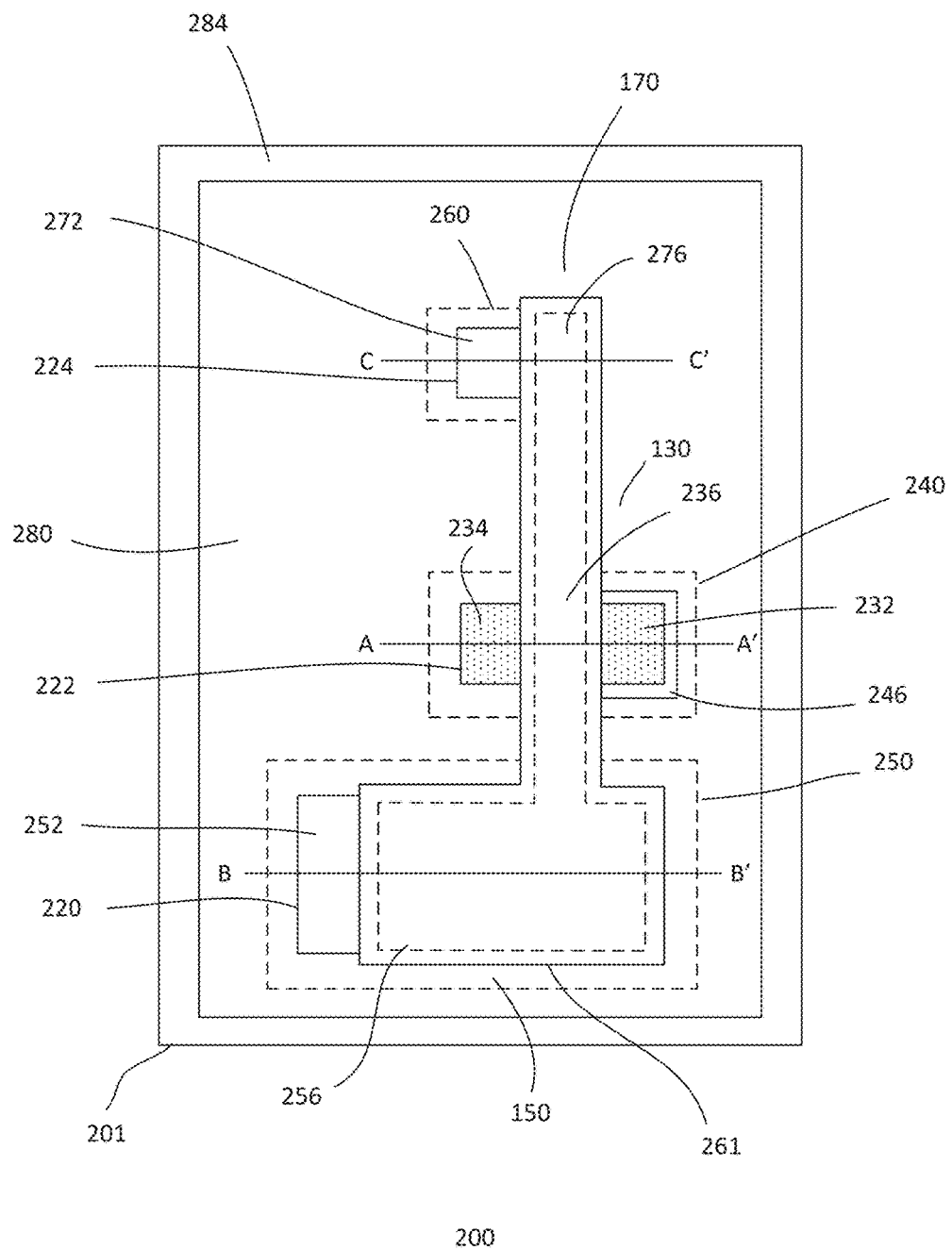
FIG. 2a shows a top view of an embodiment of a memory cell and FIGS. 2b-2c show cross-sectional views of various embodiments of the memory cell.
Figure 2B:
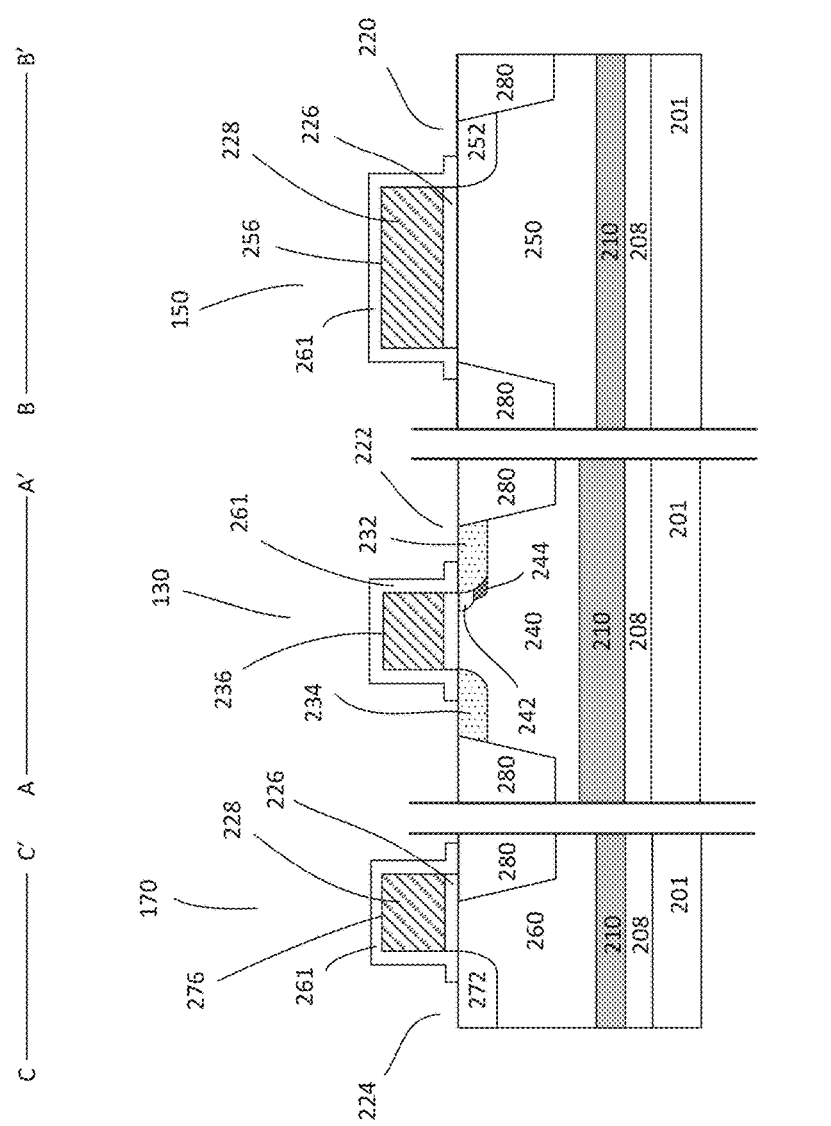
Figure 2C:
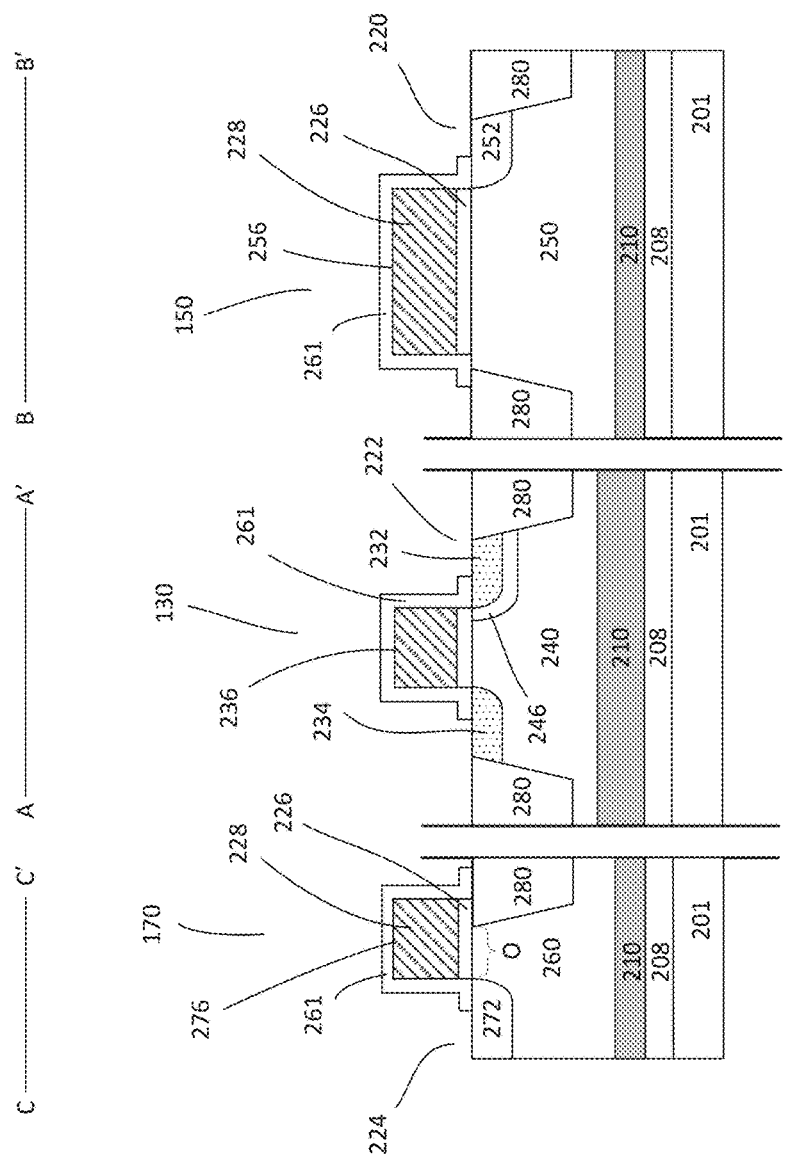

FIG. 2a shows a top view of an embodiment of a memory device and FIGS. 2b-2c show cross-sectional views of various embodiments of the memory device. The memory device includes a memory cell 200. The cross-sectional views are, for example, taken along A-A', B-B' and C-C' of the memory cell. The memory cell 200 is similar to that described in FIG. 1. In the interest of brevity, common elements and features having the same reference numerals may not be described or described in detail. The memory cell 200 as shown may be a portion of a NVM device. For example, the memory cell is a non-volatile MTP memory cell.

The memory device may include doped regions having different dopant concentrations. For example, the device may include heavily doped ($x^+$), intermediately doped (x) and lightly doped (x) regions, where x is the polarity type which can be p-type or n-type dopants. A lightly doped region may have a dopant concentration of about 1E16-1E17 $cm^{-3}$, an intermediately doped region may have a dopant concentration of about 1E17-1E18 $cm^{-3}$, and a heavily doped region may have a dopant concentration of about 1E18-1E19 $cm^{-3}$. Providing other dopant concentrations for the different types of doped regions may also be useful. For example, the dopant concentration range may be varied, depending on the technology node. P-type dopants may include boron (B), fluorine (F), aluminum (Al), indium (In) or a combination thereof, while n-type dopants may include phosphorous (P), arsenic (As), antimony (Sb) or a combination thereof.

The memory device is disposed on a substrate 201. The substrate is a semiconductor substrate, such as a silicon substrate. Other types of semiconductor substrates may also be useful. In one embodiment, the substrate 201 is a lightly doped substrate. In one embodiment, the substrate is lightly doped with dopants of a second polarity type. For example, the substrate is a lightly doped p-type (p) substrate. Providing a substrate doped with other types of dopants or undoped substrate may also be useful.

A cell region 284 is provided in the substrate 201. In one embodiment, the cell region 284 includes a memory cell size sufficient to accommodate a memory cell. The cell region, for example, is a cell region in which the memory cell 200 is disposed. Although one cell region is shown, the device may include a plurality of cell regions having memory cells interconnected to form a memory array. Additionally, the substrate may include other types of device regions, depending on the types of device or IC. For example, the device may include device regions for high voltage (HV), medium voltage (MV) and/or low voltage (LV) devices or transistors.

The cell region 284 may include first, second and third wells 240, 250 and 260. In one embodiment, the first well 240 is a transistor well while the second and third wells 250 and 260 are capacitor wells. The cell region 284, for example, includes a second well 250 for the control capacitor 150 and a third well 260 for the erase capacitor 170. In one embodiment, the third well serves as an erase well 260 for an erase gate and the second well serves as a control well 250 for a control gate. In one embodiment, the first well 240 serves as a body of a storage transistor 130. For example, the first well 240 serves as a transistor well for the storage gate 236. The erase and control capacitors may be MOS capacitors. Other types of erase and control gates may also be useful.

The various wells that will be described in more detail later may be configured as HV device well or MV device well. The MV and HV device wells may be lightly or intermediately doped wells, where the HV device well has a lower dopant concentration than the MV device well. For example, lightly or intermediately doped HV device well has a lower dopant concentration relative to the lightly or intermediately doped MV device well.

As shown, the first, second and third wells are disposed adjacent to each other. The third (or erase) well 260 accommodates the erase capacitor 170 and the second (or control) well 250 accommodates the control capacitor 150. In one embodiment, the control well 250 and the erase well 260 include same polarity type dopants. For example, the capacitor wells 250 and 260 are doped with capacitor type dopants. Other configurations of the control and erase wells may also be useful. In one embodiment, the capacitor wells 250 and 260 are sufficiently doped to form or configured as HV device wells. Preferably, the capacitor wells are sufficiently doped to withstand voltages larger than 15 V. For example, the capacitor wells are doped to sustain voltages of up to about 22 V for a breakdown voltage (BV) of 23 V. In such case, the erase and control wells are lightly doped capacitor wells. The dopant concentration of the capacitor wells is, for example, about 1E16-1E17 $cm^{-3}$. Other capacitor well dopant concentrations may also be useful. The dopant concentration may depend on, for example, the maximum voltage requirement of the program and erase terminals.

Contact regions are disposed within the erase and control wells 260 and 250. For example, the erase well 260 includes an erase contact region 272 and the control well 250 includes a control contact region 252. A contact region is a heavily doped region disposed within the lightly doped capacitor wells to minimize contact resistance to the capacitor wells. The contact regions 252 and 272 may be referred to as capacitor contact regions. In one embodiment, the capacitor wells 250 and 260 and the capacitor contact regions 252 and 272 include same polarity type dopants. The capacitor contact regions, for example, include capacitor type dopants.

The polarity type of a capacitor well may depend on the polarity type of the capacitor. In one embodiment, the polarity type of the erase well depends on the polarity type of the erase capacitor and the polarity type of the control well depends on the polarity type of the control capacitor. In another embodiment, the erase and control capacitors are the same capacitor type. For example, the erase capacitor is n-type for a n-type control capacitor. Providing other configurations of erase and control capacitors may also be useful.

A capacitor contact plug (not shown) may be disposed above a capacitor contact region. The capacitor contact plug, for example, may be a conductive contact plug, such as a tungsten contact plug. Other types of conductive contact plugs may also be useful. For example, a capacitor contact plug couples the control well to the CGL of the memory device and another capacitor contact plug couples the erase well to the EGL of the memory device.

As for the transistor well 240, it may be doped with second polarity type dopants for a first polarity type transistor. For example, the second polarity type may be p-type and the first polarity type may be n-type. In one embodiment, the transistor well is configured or tailored for a MV device. For example, the transistor well is sufficiently doped to form or configured as a MV device well. In such case, the transistor well is intermediately doped with second polarity type dopants. For example, the dopant concentration of second polarity type dopants in the transistor well may be about 1E17-1E18 $cm^{-3}$. Other suitable dopant concentrations may also be useful. The dopant concentration may depend on, for example, the maximum voltage requirement of the storage transistor. The transistor well may include a depth shallower than the capacitor wells. Other suitable depth dimensions for the capacitor and transistor wells may also be useful.

The region of the substrate under the gate 236 and between the S/D regions 232 and 234 corresponds to a channel region of the transistor 130. The channel length is between the S/D regions. However, providing S/D extension regions reduces the effective length of the channel. For example, the effective channel length with S/D extension regions is between the extension regions. However, by providing an asymmetrical transistor in which only one of the S/D regions has an extension region, the effective channel length is increased compared to symmetrical transistors in which both S/D regions have extension regions. An asymmetrical transistor results in reduced cell size compared to symmetrical transistors. For example, if a symmetrical transistor requires a channel length of 0.6 um to achieve the desired effective channel length, an asymmetrical transistor may only require a channel length of 0.4 um to achieve the same effective channel length. Other channel lengths may also be useful. For example, the length may depend on design requirements and technology node.

In one embodiment, a HV well region 210 may be provided within the isolation well 208 in the substrate. In one embodiment, the HV well region encompasses the capacitor and transistor wells. For example, the HV well region separates the first, second and third wells 240, 250 and 260 from the isolation well 208. In one embodiment, the HV well region is a common HV well region of a memory array. The HV well region, for example, encompasses a plurality of memory cells of a memory array. In one embodiment, the HV well region is lightly doped with second polarity type dopants for a first polarity type isolation well. For example, a p-type HV well region is provided for a n-type isolation well. Other configurations of HV well region 210 and isolation well 208 may also be useful. The dopant concentration of the HV well region is, for example, about 1E16-1E17 $cm^{-3}$. Other suitable dopant concentrations may also be useful. In one embodiment, the HV well region 210 and capacitor wells 250 and 260 are doped with opposite polarity type dopants. For example, a p-type HV well region is provided for n-type capacitor wells. The HV well region serves to improve isolation of the capacitor wells during programming and/or erase operations.

A cell isolation region 280, as shown, separates the capacitor and transistor wells as well as the other device regions. In one embodiment, the cell isolation region 280 sufficiently overlaps the first, second and third wells 240, 250 and 260 to isolate the different wells. The cell isolation region overlaps a portion of the different wells. For example, a bottom portion of the wells extends below the cell isolation region. The first, second and third wells, as shown, extend below and underlap the cell isolation region. Other configurations of the cell isolation region and wells may also be useful. The cell isolation region defines the active regions in the substrate. For example, the cell isolation region defines the active erase capacitor region 224 in the erase well, the active transistor region 222 in the transistor well, and the active control capacitor region 220 in the control well. The cell isolation region is, for example, a shallow trench isolation (STI) region. Providing other types of isolation region between the wells may also be useful.

A storage transistor 130 includes a transistor gate 236 disposed on the substrate and over the active transistor region 222 in the first or transistor well. In one embodiment, the transistor gate is disposed between first and second S/D regions 232 and 234. In one embodiment, the S/D regions are heavily doped with transistor type dopants. For example, n-type transistors have S/D regions with n-type dopants. The transistor gate is disposed on the substrate while the S/D regions are disposed adjacent to the gate sidewalls in the active transistor region of the substrate. The transistor gate 236 includes a gate electrode 228 and a gate dielectric 226. The gate electrode 228, for example, may be polysilicon and the gate dielectric 226 may be silicon oxide. Other types of gate electrode and gate dielectric may also be useful.

The first S/D region 232 may be disposed on a drain side of the transistor gate 236 and the second S/D region 234 may be disposed on a source side of the transistor gate. In some embodiments, the first S/D region 232 is the drain region of the storage transistor 130 and the second S/D region 234 is the source region of the storage transistor. For example, the drain region 232 serves as the drain terminal of the memory cell 200 and is coupled to a BL of the memory device while the source region 234 serves as the source terminal of the memory cell and is coupled to a SL of the memory device. Other configurations of S/D regions may also be useful.

The transistor 130 may be provided with S/D extension regions which extend from a S/D region to underlap a portion of the transistor gate 236. The S/D extension regions include, for example, a halo region 244 and a lightly doped drain (LDD) region 242. The halo region is a lightly doped region with second polarity type dopants for a first polarity type transistor. As for the LDD region, it is a lightly doped region with transistor type dopants. For example, the halo region includes p-type dopants for a n-type transistor while the LDD region includes n-type dopants for a n-type transistor. The dopant concentrations of the halo and LDD regions are lower than the S/D region. In general, the dopant concentration of the LDD is heavier or higher than the halo region. For example, the dopant concentration of the halo and the LDD regions is about 1E18 cm$^{-3}$. Providing other dopant concentrations for the LDD and halo regions may also be useful. For example, the dopant concentrations may be varied depending on the technology node. Other configurations of S/D extension regions may also be useful. For example, providing only a LDD region without a halo region may also be useful.

In one embodiment, S/D extension regions are provided at the first S/D region 232. The S/D extension regions, for example, extend from the first S/D region 232 to underlap a portion of the transistor gate 236. In some embodiments, S/D extension regions are provided at the first S/D region 232 while the second S/D region 234 is devoid of S/D extension regions. For example, only the drain region of the storage transistor 130 is provided with S/D extension regions. This provides the storage transistor 130 with an asymmetric configuration.

In one embodiment, the S/D extension region includes a depth less than the S/D regions. The depth of the S/D region is, for example, about 0.1 μm. In one embodiment, the LDD region 242 has a depth shallower than the halo region 244. As shown in FIG. 2b, the LDD region 242 extends beyond the halo region 244 to underlap a portion of the storage gate 236. For example, the LDD region overlaps the halo region. For example, the depth of the LDD region 242 is about 0.05 μm while the depth of the halo region 244 is about 0.05-0.1 μm. Other suitable depth dimensions for the S/D region and S/D extension region may also be useful. For example, the depth dimensions may be varied depending on the technology node and device operating voltages. Other configurations of S/D extension region may also be useful.

In another embodiment, a S/D extension region devoid of a halo region is provided at the first S/D region 232. For example, the first S/D region 232 is provided with only a LDD region. As shown in FIG. 2c, a S/D extension region without halo region may include a deeply doped LDD region 246. In the case of a deep LDD region, the depth of the LDD region may be deeper than the first S/D region 232. For example, the deep LDD region 246 encompasses the first S/D region 232. The depth of the deep LDD region 246 may be about 0.1-0.3 μm. Other suitable depth dimensions may also be useful. A LDD region in such a configuration may be formed with a highly graded LDD profile to improve hot carrier reliability.

The region of the substrate under the gate 236 and between the S/D regions 232 and 234 corresponds to a channel region of the transistor 130. As described, the transistor 130 is an asymmetrical transistor of which the drain region is provided with at least one S/D extension region and the source region is devoid of any S/D extension region. In one embodiment, the effective channel length of the asymmetrical transistor 130 is reduced relatively to a symmetrical transistor due to the absence of LDD and/or halo regions in the source region, which contributed to a smaller cell size. In one embodiment, the minimum effective channel length of the asymmetrical transistor 130 is about 0.4 μm with a 5 V transistor set up. For example, the effective channel length is about 0.13 μm. Providing other suitable effective channel length dimensions may also be useful, for example, depending on design requirements.

A control capacitor 150 includes a control gate 256 disposed on the substrate. In one embodiment, the control gate is disposed over the active control capacitor region 220 in the second or control well 250. The control gate includes a control gate electrode 228 over a control gate dielectric 226. The control gate electrode 228, for example, may be polysilicon and the control gate dielectric 226 may be silicon oxide. Other types of gate electrode or dielectric materials may also be useful. The control gate electrode, in one embodiment, is doped with capacitor type dopants. For example, the control gate electrode is heavily doped with same polarity type dopants as the control well.

A control contact region 252 is disposed within the active control capacitor region 220 and adjacent to a sidewall of the control gate 256. The control contact region is a heavily doped region disposed within the control well 250. In one embodiment, the control contact region is doped to a depth that is about the depth of the transistor S/D regions 232 and 234. For example, the depth of the control contact region may be about 0.1 μm. Other suitable depth dimensions for the control contact region may also be useful. In one embodiment, the control contact region is disposed adjacent to the control gate 256 without underlapping the control gate. For example, the control contact region 252 may extend to about the sidewall of the control gate 256. Other configurations of the control contact region may also be useful.

Although only one control contact region 252 is shown, it is to be understood that providing other suitable number of control contact regions may also be useful, depending on the desired cell size.

The control contact region serves as a contact region to provide biasing for the control well. The control contact region, for example, improves the conductive connection between a conductive contact plug (not shown) and the control well. In one embodiment, the control gate electrode is doped before forming the control contact region. For example, a gate electrode layer deposited on the substrate is pre-doped with capacitor type dopants and patterned to form the control gate electrode.

An erase capacitor 170 includes an erase gate 276 disposed on the substrate. In one embodiment, the erase gate is disposed over the active erase capacitor region 224 in the erase well 260. The erase gate includes an erase gate electrode 228 over an erase gate dielectric 226. The erase gate electrode, for example, may be polysilicon and the erase gate dielectric may be silicon oxide. Other types of gate electrode or dielectric materials may also be useful. The erase gate electrode, in one embodiment, is doped with capacitor type dopants. For example, the erase gate electrode is heavily doped with same polarity type dopants as the control gate electrode. Other configurations of erase and control gate electrodes may also be useful.

An erase contact region 272 is disposed within the active erase capacitor region 224 and adjacent to a second sidewall of the erase gate 276. The erase contact region is a heavily doped region disposed within the erase well 260. In one embodiment, the erase contact region is doped to a depth that is about the depth of the control contact region 252. Other suitable depth dimensions for the erase contact region may also be useful. In one embodiment, the erase contact region is disposed adjacent to the erase gate 276 without underlapping the erase gate. For example, the erase contact region 272 may extend to about the sidewall of the erase gate. Other configurations of the erase contact region may also be useful.

Although only one erase contact region 272 is shown, it is to be understood that providing other suitable number of erase contact regions may also be useful, depending on the desired cell size.

As shown in FIGS. 2b-2c, the erase gate 276 is positioned to overlap a portion of the cell isolation region 280. For example, a first side of the erase gate extends over the cell isolation region 280, while a second side of the erase gate extends over the erase well. The erase gate, for example, sufficiently overlaps the cell isolation region 280 to minimize coupling between the erase gate and the erase well. This allows the electric potential difference between the erase well and erase gate to improve, which in turn helps to shorten erase time or lower erase voltage. For example, if 10 V is applied at erase well, the potential difference between erase well and erase gate is 5 V if coupling ratio is 0.5 (10-10×0.5); while the potential difference could be as high as 9 V if coupling ratio is 0.1 (10-10×0.1). An exemplary length of overlap between the erase gate and erase well should be as small as possible, provided design rules are satisfied. For example, the exemplary length of overlap between the erase gate and erase well is about 0.1 μm.

Conductive contact plugs (not shown) may be disposed above the erase and control contact regions 252 and 272. For example, the conductive contact plugs are in contact with the erase and control wells 250 and 260. In one embodiment, the conductive contact plug above the control contact region 252 couples the control well 250 to the CGL of the memory device while the conductive contact plug above the erase contact region 272 couples the erase well 260 to the EGL of the memory device. The erase contact region may serve as the erase terminal and the control contact region may serve as the control terminal of the memory cell 200. For example, metal lines may be provided in one or more metal levels of back-end-of-line (BEOL) interconnect levels.

In one embodiment, the gate electrode 228 of the transistor and capacitor gates are commonly coupled. For example, the erase gate 276, control gate 256 and storage gate 236 are formed of the same gate layers. In such case, the erase, control and storage gates are formed of the same material. For example, the gate electrode and gate dielectric layers of the erase and control gates are formed of the same material and thickness as the storage gate electrode and gate dielectric layers. In one embodiment, the gate dielectric layer used for the storage, erase and control gates includes a thickness suitable for medium voltage devices. The gate electrodes are, for example, doped with capacitor type dopants. Providing gate electrodes with other dopant types may also be useful. Other configurations of the gates may also be useful. For example, the different gates layers may also form the transistor and capacitor gates.

Dielectric spacers (not shown) may be provided on the sidewalls of the transistor gate 236 and capacitor gates 256 and 276. The spacers may be used to facilitate forming transistor S/D regions and capacitor contact regions. For example, the spacers function as implant masks to align the transistor S/D regions and capacitor contact regions.

Metal silicide contacts (not shown) may be provided on contact regions of the memory cell. The metal silicide contacts, for example, may be nickel or nickel-based metal silicide contacts. Other suitable types of metal silicide contacts, including cobalt or cobalt-based metal silicide contacts, may also be useful. In one embodiment, metal silicide contacts are provided on the exposed portions of the transistor S/D regions 232 and 234, and on the exposed portions of the capacitor contact regions 252 and 272. In one embodiment, a silicide block 261 overlaps a portion of the contact regions of the memory cell and wraps around the erase, storage and control gates. For example, the silicide block completely lines the top and sidewalls of the transistor and capacitor gates. The silicide block, for example, is a dielectric material, such as silicon oxide or silicon nitride. Other types of silicide blocks may also be useful. Providing a silicide block over the erase, storage and control gates prevents formation of silicide contacts on these gates. This improves data retention.

The various conductive lines of the memory cell, such as the SL, BL, CGL and EGL, may be disposed in metal levels of the memory device. Conductive lines disposed in the same direction may be provided in the same metal level. For example, conductive lines disposed along the bitline direction may be disposed in metal level $M_X$ while conductive lines disposed along the wordline direction may be disposed in $M_{X+1}$ of the device. Other configurations of conductive lines and metal levels may also be useful.

Figure 3:
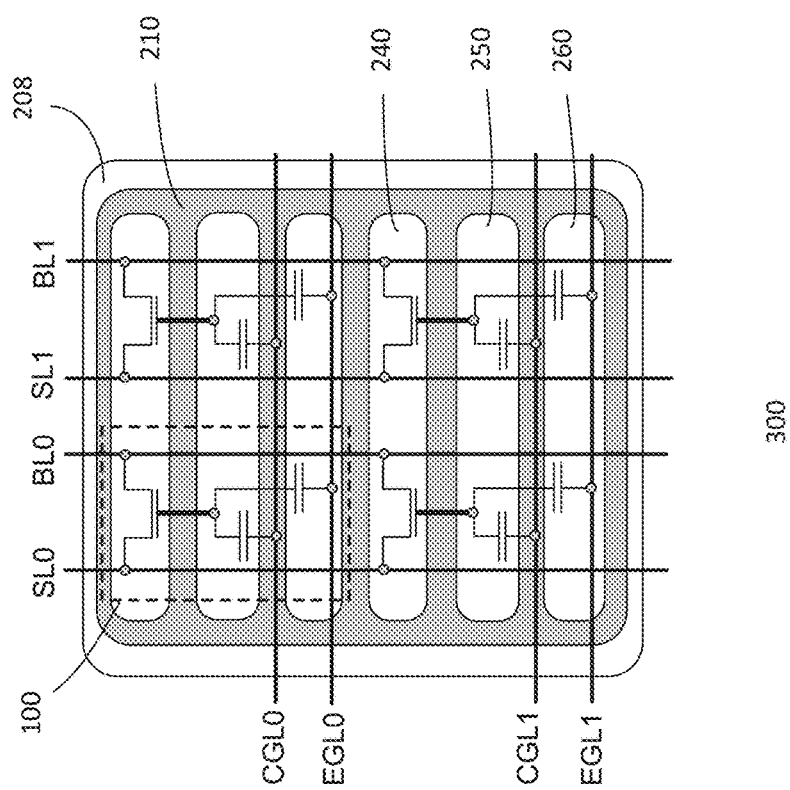
FIG. 3 shows a schematic diagram of an embodiment of a memory array.

FIG. 3 shows a schematic diagram of an embodiment of a memory array 300. A portion of the array is shown with, for example, four memory cells 100, such as those described in FIGS. 1 and 2a-2c. In the interest of brevity, common elements and features having the same reference numerals may not be described or described in detail.

The array of memory cells may be formed on a substrate having active transistor and capacitor regions. In one embodiment, the active transistor region includes a transistor well 240 and the active capacitor regions include capacitor wells 250 and 260. For example, the active capacitor regions include erase and control wells 260 and 250. The different wells are disposed within a HV well region 210. The HV well region is, for example, surrounded by an isolation well 208, which is common to a plurality of device regions of a memory chip. In one embodiment, the transistor and capacitor wells may extend across multiple columns of interconnected memory cells of an array, as shown. For example, the transistors and capacitors of a memory array may be provided with common transistor and capacitor wells. Other configurations of transistor and capacitor wells may also be useful.

As shown, the memory cells are interconnected to form two columns connected by BLs (e.g., BL0 and BL1) and SLs (e.g., SL0 and SL1) and two rows of memory cells connected by CGLs (e.g., CGL0 and CGL1) and EGLs (e.g., EGL0 and EGL1). In one embodiment, the source and drain terminals of each column of memory cells are coupled to a common SL and BL disposed in a bitline direction. For example, the source and drain terminals of a first column of memory cells are commonly coupled to SL0 and BL0, while the source and drain terminals of a second column of memory cells are commonly coupled to SL1 and BL1. In one embodiment, the control and erase terminals of each row of memory cells are coupled to a common CGL and EGL disposed in a wordline direction. For example, the control and erase terminals of a first row of memory cells are commonly coupled to CGL0 and EGL0, while the control and erase terminals of a second row of memory cells are commonly coupled to CGL1 and EGL1. The memory cells may be interconnected to form a NOR-type array configuration. Having a NOR-type array configuration provides random access to the memory cell and reduces footprint of an array. Other configurations of an array may also be useful.

Although a 2×2 portion of an array is shown, it is understood that the array may include numerous rows and columns.

The memory cell of FIGS. 1 and 2a-2c include a transistor (1T) and first and second capacitors (2C) to provide a 1T-2C memory cell configuration. In one embodiment, the storage transistor 130 is the same polarity type as the control and erase capacitors 150 and 170. For example, the memory cell is configured with a n-type transistor and n-type capacitors. In such cases, the transistor well 240 and capacitor wells 250 and 260 include opposite polarity type dopants. For example, the transistor well includes second polarity type or p-type dopants while the capacitor wells include first polarity type or n-type dopants.

The memory cell as described may include various operating modes. Appropriate voltages may be applied to the various terminals of a memory cell via the BL, CGL, EGL and SL to perform different memory operations. The different memory operations may include program, read and erase operations. Table 1 below shows exemplary biasing conditions of the memory array 300 for selected and non-selected memory cells during different memory operations:

TABLE 1

| Signals | CGL | | BL | | SL | | EGL | |
|---|---|---|---|---|---|---|---|---|
| Modes | sel | unsel | sel | unsel | sel | unsel | sel | unsel |
| PGM: FN | $V_{pp}$ | 0 V | 0 V | $V_{dd}$ | 0 V | $V_{dd}$ | 0 V | 0 V |
| ERS: FN | 0 V | 0 V | 0 V | 0 V | 0 V | 0 V | $V_{pp}$ | 0 V |
| Read | $V_{read}$ | 0 V | $V_{read}$ | 0 V | 0 V | 0 V | 0 V | 0 V |

As shown in Table 1, the biasing values are the same for programming and erase operations, simplifying operational voltage requirements. In one embodiment, $V_{pp}$ is a high voltage value above 15 V and $V_{dd}$ is a medium voltage value. For example, $V_{pp}$ may be up to about 22 V and $V_{dd}$ may be about 5 V. As for $V_{read}$, it may be equal to about 1 V. Other $V_{read}$ may also be useful, depending on the desired read current. Other suitable biasing voltage values and conditions may also be useful. Select (sel) signals are provided at the terminals of a selected cell while unselect (unsel) signals are provided at the terminals of non-selected cells.

The memory cell may operate in Fowler-Nordheim (FN) tunneling program mode. In a FN tunneling program mode, electron carriers tunnel through from the transistor well to the floating gate (FG). Other suitable types of programming modes may also be useful. To effect a programming operation on a selected memory cell (e.g., the memory cell 100 surrounded by dotted lines as shown in FIG. 3), the control terminal of the selected memory cell is biased with $V_{pp}$ by a CGL (e.g., CGL0), while the source and drain terminals of non-selected memory cells along the same row as the selected memory cell are biased with $V_{dd}$ by SL and BL (e.g., SL1 and BL1). It will be appreciated that $V_{dd}$ is of a reasonable voltage to prevent effecting a programming operation at the non-selected memory cells along the same row as the selected memory cell. Should the $V_{dd}$ be too high, during program operation, the cell in the diagonal directions may be erased and should the $V_{dd}$ be too low, the cell in the same row may be programmed due to insufficient inhibit. On the other hand, the control terminals of non-selected memory cells along the same column as the selected memory cell are biased with 0 V to inhibit programming.

The memory cell may operate in FN tunneling erase mode. In a FN tunneling erase mode, electron carriers move from the erase gate to the erase well. To effect an erase operation, the erase terminal of the selected memory cell is biased with $V_{PP}$ by an EGL (e.g., EGL0). The erase mode, for example, may effect a sector erase operation. As shown in FIG. 3, as memory cells along the same row are coupled to the same EGL, these memory cells may be erased simultaneously.

As for a read operation, both control and drain terminals of the selected memory cell are biased with $V_{read}$ to effect the read operation. For example, the selected memory cell is biased with $V_{read}$ by a CGL and BL (e.g., CGL0 and BL0).

The memory cell as described in FIGS. 1 and 2a-2c results in advantages. The erase terminal and the control terminal, as shown, share the same junction configuration. For example, the HV erase well 260 is connected to the MV transistor well 240 and HV well region 210 at the erase terminal, while the HV capacitor well 250 is connected to the MV transistor well 240 and HV well region 210 at the control terminal as shown in FIGS. 2a-2c. With the same junction configuration at the erase and control terminals, the same voltage values may be applied at the erase and control terminals for erase and program operations of the memory cell. This reduces the number of terminal voltages to be applied for operating the memory cell. For example, terminal voltage requirements may be simplified to require only two different voltage levels (i.e., $V_{PP}$ and $V_{read}$) to operate the memory cell 200. Furthermore, with the same voltage value applicable for both control and erase terminals, smaller macro design and size may be achieved due to shared charge pump for program and erase operations.

Moreover, the presence of the HV capacitor well/HV well region junction increases the junction breakdown voltage (BV), allowing higher voltage values to be applied at the control and erase terminals. By using a high voltage to perform the program and/or erase operations, programming and/or erase time per cycle is significantly reduced, enhancing the programming/erasing speeds of the memory device. The configuration and arrangement of the memory cell as described allow erase operation and program operation to be performed on different regions of the memory cell, thereby decoupling programming and erase operations. This improves endurance of the memory cell. In addition, the 1T-2C memory cell configuration as described enables a relatively small cell size of less than 15 μm² to be achieved. For example, the memory cell size may be about 9.8 μm².

Figure 4A:
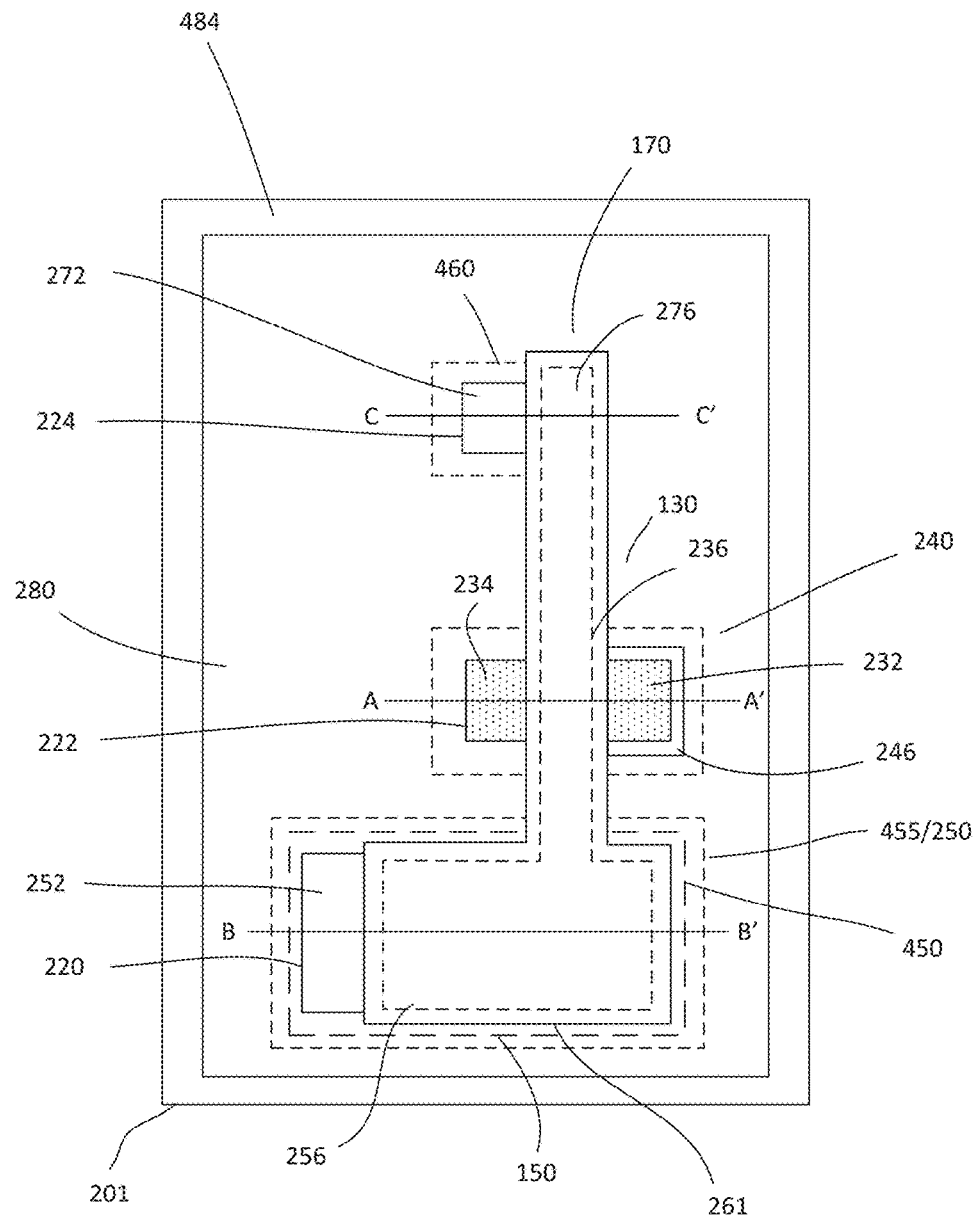
FIG. 4a shows a top view of another embodiment of a memory cell and FIGS. 4b-4c show cross-sectional views of various embodiments of the memory cell.
Figure 4B:
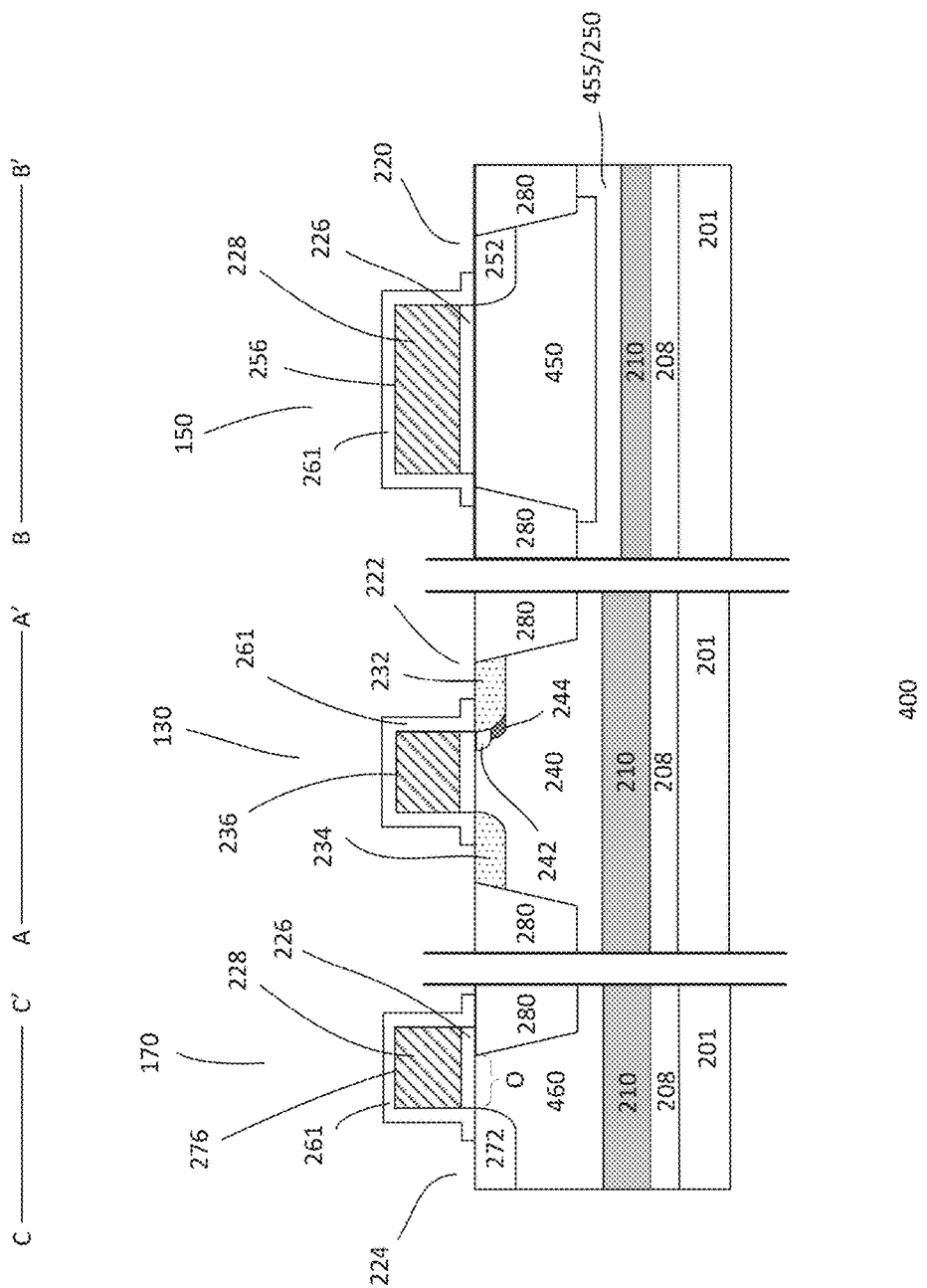
Figure 4C:
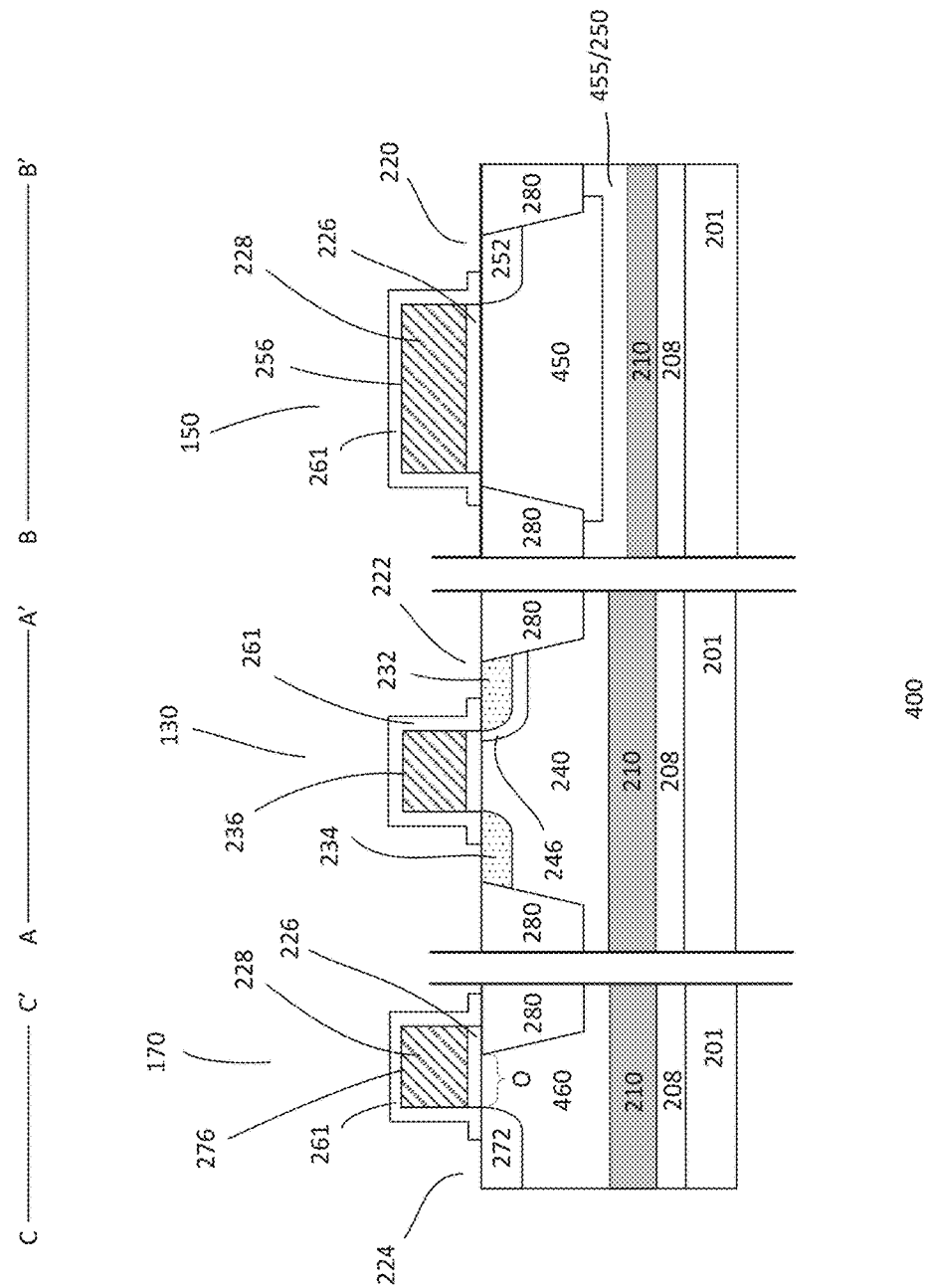

FIG. 4a shows a top view of an embodiment of a memory device and FIGS. 4b-4c show cross-sectional views of various embodiments of the memory device. The memory device includes a memory cell 400. The cross-sectional views are, for example, taken along A-A', B-B' and C-C' of the memory cell. The memory cell 400 is similar to that described in FIGS. 1 and 2a-2c. In the interest of brevity, common elements and features having the same reference numerals may not be described or described in detail. As such, the description of the memory cell 400 below primarily focuses on the difference(s) compared with the memory cell 200 described in FIGS. 2a-2c.

A cell region 484 is provided in the substrate 201. In one embodiment, the cell region 484 includes a memory cell size sufficient to accommodate a memory cell. The cell region 484 may include a cell size smaller than the cell region 284 of FIG. 2a. The cell region 484, for example, is a cell region in which the memory cell 400 is disposed. Although one cell region is shown, the device may include a plurality of cell regions having memory cells interconnected to form a memory array. Additionally, the substrate may include other types of device regions, depending on the type of device or IC. For example, the device may include device regions for HV, MV, LV devices.

In one embodiment, the cell region 484 may include first, second, third and fourth wells 240, 450, 460 and 455. The various wells, in one embodiment, may be configured as LV, MV or HV device wells. The LV, MV and HV device wells may be lightly or intermediately doped wells, where the HV device well has the lowest dopant concentration than the LV and MV device wells. For example, lightly or intermediately doped HV device well has the lowest dopant concentration relative to the lightly or intermediately doped LV and MV device wells, while the lightly or intermediately doped MV device well has a lower dopant concentration relative to the lightly or intermediately doped LV device well.

In one embodiment, the first well 240 is a transistor well while the second and third wells 450 and 460 are capacitor wells. The cell region 484, for example, includes a second well 450 for the control capacitor 150 and a third well 460 for the erase capacitor 170. In one embodiment, the third well serves as an erase well 460 for an erase gate 276 and the second well serves as a control well 450 for a control gate 256. In one embodiment, the control well 450 and the erase well 460 include same polarity type dopants. For example, the capacitor wells 450 and 460 are doped with capacitor type dopants. Other configurations of the control and erase wells may also be useful.

The capacitor wells 450 and 460 differ from the capacitor wells 250 and 260 of FIGS. 2a-2c in that the erase and control wells 450 and 460 are sufficiently doped to form or configured as LV device wells. For example, the capacitor wells are doped to sustain voltages of up to about 15 V. The dopant concentration of the capacitor wells is, for example, about 1E18 cm$^{-3}$. Other suitable capacitor well dopant concentrations may also be useful. The dopant concentration may depend on, for example, the maximum voltage requirement of the program and erase terminals.

As shown, the control well 450 is disposed within the fourth well 455. For example, the fourth well encompasses the control well 450 and separates a bottom portion of the control well 450 from the transistor well 240 and HV well region 210. In one embodiment, the fourth well is sufficiently doped to form or configured as a HV device well. The fourth well, for example, is lightly doped with capacitor type dopants. For example, the control well and fourth well include same polarity type dopants. Other configurations of control well and fourth well may also be useful. The dopant concentration of the fourth well is, for example, about 1E16-1E17 cm$^{-3}$. Other dopant concentrations may also be useful. The fourth well serves to improve isolation of the control well 450 during programming operations. The fourth well 455 may be referred to as the second isolation well. For example, the second isolation well 455 is disposed within the first isolation well 208 and isolates the control well 450 from the transistor well 240.

It is to be appreciated that the second or control well 250 described in FIGS. 2a-2c may serve as the presently described fourth well 455. For example, the control well 250 of FIGS. 2a-2c may be deployed as the fourth well 455 of FIGS. 4a-4c. Other suitable configurations of the fourth well may also be useful.

The fourth well may include a depth deeper than the control well 450. In one embodiment, the transistor well 240, control well 450 and erase well 460 are formed to about the same depth from the substrate surface. For example, the fourth well 455 extends from the substrate surface to a depth below the transistor well 240 and capacitor wells 450 and 460.

Figure 5:
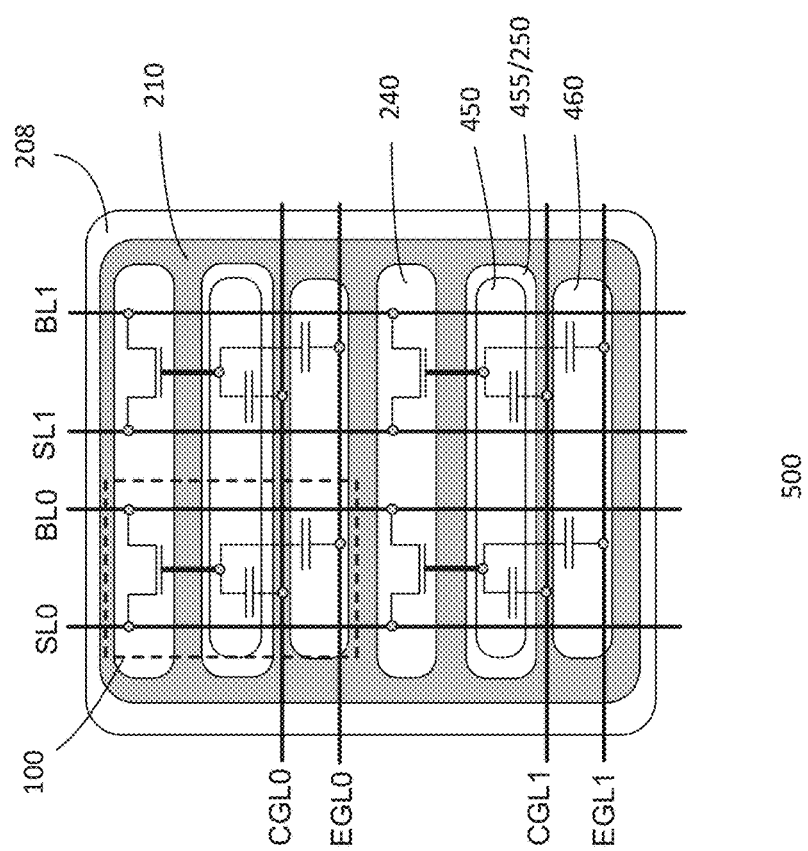
FIG. 5 shows a schematic diagram of another embodiment of a memory array.

FIG. 5 shows a schematic diagram of another embodiment of a memory array 500. A portion of the array is shown with, for example, four memory cells 100, such as those described in FIGS. 1 and 4a-4c. The memory array 500 is similar to that described in FIG. 3. In the interest of brevity, common elements and features having the same reference numerals may not be described or described in detail. As such, the description of the memory array 500 below primarily focuses on the difference(s) compared with the memory array 300 shown in FIG. 3.

The array of memory cells may be formed on a substrate having active transistor and capacitor regions. In one embodiment, the active transistor region includes a transistor well 240 and the active capacitor regions include capacitor wells 450 and 460. For example, the active capacitor regions include erase and control wells 460 and 450. In one embodiment, the control well 450 is disposed within a fourth well 455. The fourth well, for example, includes the same configuration as the control well 250 shown in FIGS. 2a-2c. As described, the erase and control wells 460 and 450 are configured as LV device wells, the transistor well is configured as MV device well while the fourth well is configured as HV device well. The fourth well 455 is provided to improve isolation between the control well 450 and the transistor well 240. The different wells are disposed within a HV well region 210. The HV well region is, for example, surrounded by an isolation well 208, which is common to a plurality of device regions of a memory chip. In one embodiment, the transistor and capacitor wells may extend across multiple columns of interconnected memory cells of an array, as shown. For example, the transistors and capacitors of a memory array may be provided with common transistor and capacitor wells and a common fourth well 455. Other configurations of the different wells may also be useful.

As shown, the memory cells are interconnected to form two columns connected by BLs (e.g., BL0 and BL1) and SLs (e.g., SL0 and SL1) and two rows of memory cells connected by CGLs (e.g., CGL0 and CGL1) and EGLs (e.g., EGL0 and EGL1). The memory cells may be interconnected to form a NOR-type array configuration. Other configurations of an array may also be useful.

Although a 2×2 portion of an array is shown, it is understood that the array may include numerous rows and columns.

The memory cell 400 of FIGS. 4a-4c includes a 1T-2C memory cell configuration. In one embodiment, the storage transistor 130 is the same polarity type as the control and erase capacitors 150 and 170. For example, the memory cell is configured with a n-type transistor and n-type capacitors. In such cases, the transistor well 240 and capacitor wells 450 and 460 include opposite polarity type dopants. For example, the transistor well includes second polarity type or p-type dopants while the capacitor wells include first polarity type or n-type dopants.

The memory cell 400 may include various operating modes. Appropriate voltages may be applied to the various terminals of a memory cell via the BL, CGL, EGL and SL to perform different memory operations. The different memory operations may include program, read and erase operations. Table 2 below shows exemplary biasing conditions of the memory array 500 for selected and non-selected memory cells during different memory operations:

TABLE 2

| Signals | CGL | | BL | | SL | | EGL | |
|---|---|---|---|---|---|---|---|---|
| Modes | sel | unsel | sel | unsel | sel | unsel | sel | unsel |
| PGM: FN (bit) | $V_{pp}$ | 0 V | 0 V | $V_{dd}$ | 0 V | $V_{dd}$ | 0 V | 0 V |
| ERS: FN (block or column) | 0 V | 0 V | 0 V | 0 V | 0 V | 0 V | $V_{pp}$ | 0 V |
| Read | $V_{read}$ | 0 V | $V_{read}$ | 0 V | 0 V | 0 V | 0 V | 0 V |

As shown in Table 2, the biasing values are the same for programming and erase operations, simplifying operational voltage requirements. In one embodiment, $V_{pp}$ is a high voltage value and $V_{dd}$ is a medium voltage value. For example, $V_{pp}$ may be up to about 13 V and $V_{dd}$ may be about 5 V. As for $V_{read}$, it may be equal to about 1 V, depending on the desired read current requirement. Other suitable biasing voltage values and conditions may also be useful. Select (sel) signals are provided at the terminals of a selected cell while unselect (unsel) signals are provided at the terminals of non-selected cells. The memory cell 400 employ, for example, Fowler-Nordheim (FN) tunneling for program and erase operations.

The memory cell 400 as described in FIGS. 4a-4c may include the same or similar advantages as that described in FIGS. 2a-2c. In addition, the presence of the fourth well 455 which is configured as HV device well increases the junction breakdown voltage (BV), allowing higher voltage value to be applied at the control terminal. Moreover, by providing a LV control well 450 with a higher dopant concentration relative to the control well 250 shown in FIGS. 2a-2c, the coupling ratio between the floating gate and control capacitor is increased. This shortens the programming time per cycle, further enhancing programming speed of the memory device. Furthermore, by configuring the erase well 460 as a LV device well and applying smaller design rule for LV device well to LV device well spacing, they allow smaller cell size relative to the cell size of FIG. 2a to be achieved. For example, a memory cell size of about 9.0 μm² may be achieved.

Figure 6:
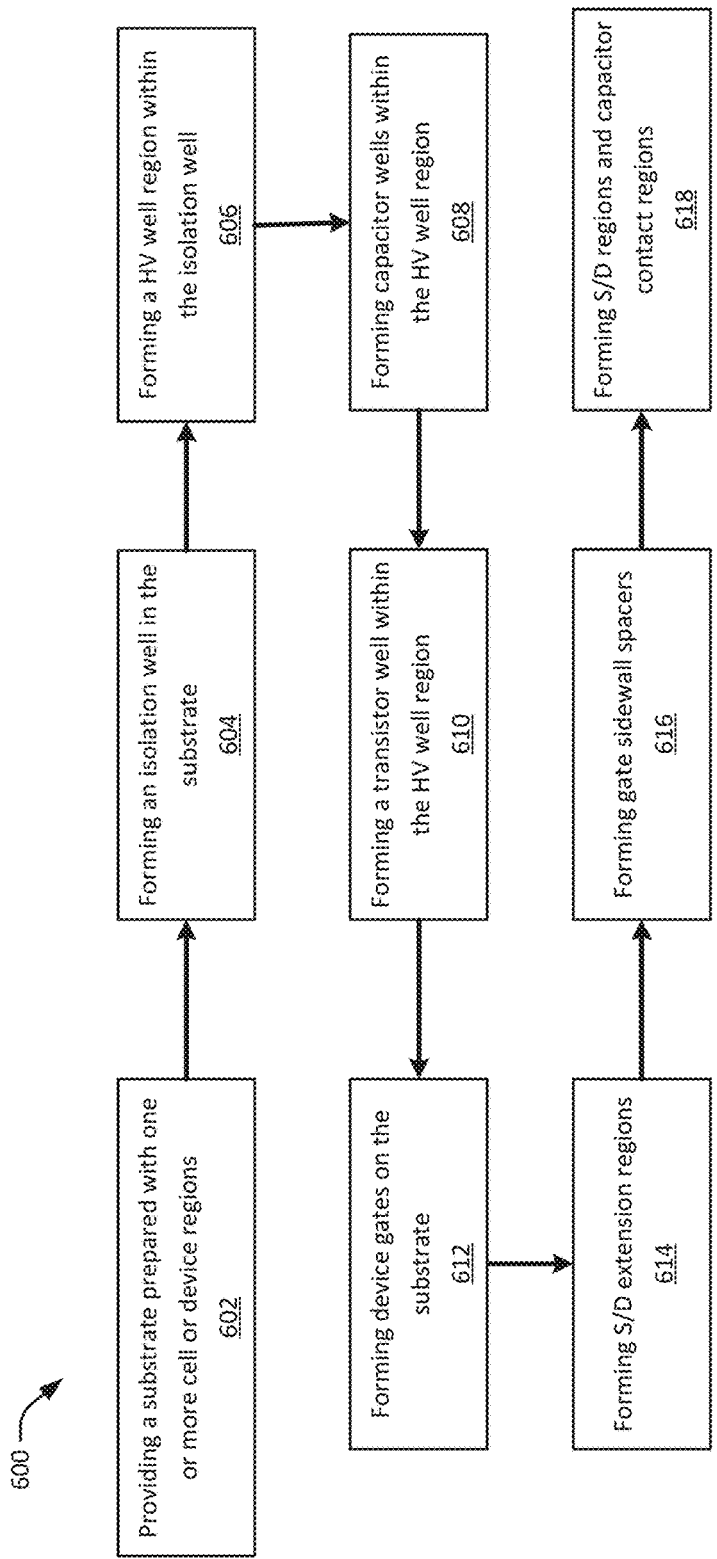
FIG. 6 shows a process for forming an embodiment of a memory cell.

FIG. 6 shows a process 600 for forming an embodiment of the memory cell described herein. In particular, process 600 illustrates an exemplary semiconductor manufacturing process flow to form the memory cell 200 described in FIGS. 2a-2c. In the interest of brevity, common elements may not be described or described in detail.

At 602, the process of forming the device includes providing a substrate prepared with one or more cell or device regions. The substrate is, for example, lightly doped with second polarity type dopants, such as p-type dopants. Providing a substrate doped with other types of dopants or undoped substrate may also be useful. A device region is isolated from another device region by device isolation regions, such as shallow trench isolation (STI) regions. In one embodiment, the device isolation regions define active regions of a memory cell, such as active transistor and capacitor regions. For example, the active capacitor regions include an active control capacitor region and an active erase capacitor region. The device isolation regions may isolate the active transistor and capacitor regions and other device regions, such as HV, MV and/or LV devices. In one embodiment, forming the device isolation region includes forming a trench in the substrate and forming an insulation layer which fills the trench. A planarization process is performed to form a planar STI region.

At 604, an isolation well is formed in the substrate. In one embodiment, the isolation well is a common isolation well encompassing memory arrays of a memory chip. The isolation well is, for example, a deep isolation well implanted to a depth below the device isolation regions. Other methods of forming the isolation well may also be useful. In one embodiment, a first polarity type isolation well is formed for a second polarity type substrate. For example, the isolation well is lightly doped with n-type dopants for a p-type substrate. Other dopant concentrations and dopant types may also be useful.

At 606, a HV well region is formed within the isolation well. For example, the isolation well encompasses the HV well region. In one embodiment, the HV well region is a common HV well region encompassing an array of interconnected memory cells. The HV well region is, for example, implanted to a depth shallower than the isolation well but deeper than the device isolation regions. Other techniques for forming the HV well region may also be useful. In one embodiment, a second polarity type HV well region is formed for a first polarity type isolation well. For example, the HV well region is lightly doped with p-type dopants for a n-type isolation well. Other dopant concentrations may also be useful. Other configurations of HV well region and isolation well may also be useful.

At 608, capacitor wells are formed within the HV well region. For example, erase and control wells are formed in active capacitor regions within the HV well region. To form the capacitor wells, an implant mask which selectively exposes the active capacitor regions is employed. Capacitor type dopants are implanted into the exposed substrate portions to form the capacitor wells. For example, the implant mask is patterned to block the active transistor region from receiving capacitor type dopants. In one embodiment, an implant process implants capacitor type dopants to simultaneously form the control and erase capacitor wells. For example, the implant includes implanting first polarity type dopants to form first polarity type control and erase capacitor wells. The dopants are implanted with the appropriate dose and power to form capacitor wells having the desired depth and dopant concentration. The control and erase wells are, in one embodiment, implanted to about equal depths and with about equal dopant concentrations. Other techniques for forming the capacitor wells may also be useful. The control well may be referred to as a first capacitor well and the erase well may be referred to as a second capacitor well. The first and second capacitor wells may be lightly doped wells. For example, the capacitor wells are sufficiently doped or configured as HV device wells. Other configurations of capacitors wells may also be useful. In one embodiment, the first and second capacitor wells may be simultaneously formed with first polarity type HV device wells for HV devices or transistors on the same substrate.

At 610, a transistor well is formed within the HV well region. For example, the transistor well is formed in an active transistor region within the HV well region. To form the transistor well, an implant mask which selectively exposes the active transistor region is employed. Second polarity type dopants are implanted into the exposed substrate portion to form the transistor well. For example, the implant mask is patterned to block the active capacitor regions from receiving the second polarity type dopant. The second polarity type dopant may be an opposite polarity type to the capacitor type dopants. For example, the second polarity type dopants are p-type for n-type erase and control wells. The dopants are implanted with the appropriate dose and power to form a transistor well having the desired depth and dopant concentration. Other techniques for forming the transistor well may also be useful. The transistor well serves as the body of a storage transistor. The transistor well may be an intermediately doped well. For example, the transistor well is sufficiently doped or configured as a MV device well. Other configurations of transistor well may also be useful. In one embodiment, the transistor well may be simultaneously formed with second polarity type MV device wells for MV devices or transistors on the same substrate.

At 612, device gates are formed on the substrate. A gate dielectric layer is deposited on the substrate and traversed the cell region of a memory cell. For example, a silicon oxide layer is formed on the substrate to form the gate dielectrics of the transistor and capacitor gates. In one embodiment, a gate electrode layer, such as a polysilicon layer, is deposited on the gate dielectric layer and traversed the cell region of the memory cell. A patterning process patterns the gate electrode and gate dielectric layers to define the transistor gate and the capacitor gates of the memory cell. The patterning process may include a mask and etch technique to pattern the gate layers. Other techniques may also be employed to define the various gates of the memory cell. In one embodiment, the transistor and capacitor gates are formed from the same gate layers. For example, the patterning process simultaneously forms the transistor and capacitor gates. The capacitor gates are, for example, commonly coupled to the transistor gate. In such case, the different gates of the memory cell may include the same gate layers. For example, the transistor and capacitor gates include the same gate dielectric thickness and same gate electrode material. In one embodiment, the gate electrode layer is a doped polysilicon layer. For example, a gate electrode of a control and erase gate is pre-doped with capacitor type dopants. The patterning process may also be employed to form gates on other device regions of the substrate. For example, different gate electrode and gate dielectric layers may be patterned to form gates on other device regions such as HV, MV and/or LV device regions.

At 614, S/D extension regions are formed. In one embodiment, asymmetrical S/D extension regions are formed in the substrate region where the drain region of the transistor will be subsequently formed. The S/D extension regions may include a halo region and a LDD region. In one embodiment, the S/D extension regions are formed adjacent to the transistor gate. For example, LDD and halo regions are formed adjacent to the drain side of the transistor gate and may extend to underlap the gate. A common implant mask may be employed to form the LDD and halo regions in an exposed substrate region between the transistor gate and device isolation region. For example, the implant mask is patterned to block the substrate region adjacent to a source side of the transistor gate. A first angled implant step (or halo implant) may be performed to implant second polarity type dopants to form a halo region in the exposed substrate region. A second angled implant step (or LDD implant) may be performed to implant first polarity type dopants to form a LDD region overlapping the halo region. The dopants are implanted at the appropriate angle with the appropriate dose and power to form halo and LDD regions having the desired configurations. Other suitable techniques may also be used to form asymmetrical S/D extension regions of the transistor.

In another embodiment, an asymmetrical LDD region is formed in the exposed substrate region without forming a halo region prior to the LDD implant. In such case, a deep LDD region may be implanted adjacent to the drain side of the transistor gate and may extend to underlap the gate. For example, the LDD region is formed to a depth deeper than the transistor S/D regions which will be subsequently formed.

At 616, gate sidewall spacers are formed. For example, gate sidewall spacers are formed on sidewalls of the transistor and capacitor gates. A dielectric spacer layer may be deposited on the substrate and over the device regions. The dielectric layer, for example, may be silicon oxide. Other types of dielectric material, such as silicon nitride, may also be used. The dielectric spacer layer is patterned to form the gate sidewall spacers. The sidewall spacers, for example, overlap the S/D extension regions.

At 618, S/D regions and capacitor contact regions are formed. For example, heavily doped regions implanted into the transistor well form S/D regions while heavily doped regions implanted into the capacitor wells form capacitor contact regions. In one embodiment, the exposed active transistor and capacitor regions adjacent to the sidewall spacers are heavily doped with capacitor type dopants to form the transistor S/D regions and capacitor contact regions simultaneously. For example, the transistor S/D regions and capacitor contact regions include same polarity type dopants. A suitable implantation technique may be employed to form the transistor S/D regions, erase contact region and control contact region with suitable dopant concentrations and depth dimensions. Other suitable techniques may also be employed to form the S/D regions and contact regions. The gate sidewall spacers may serve as implant masks to align S/D regions and capacitor contact regions to the spacers. An annealing process may be performed thereafter to activate the dopants. After annealing, the S/D regions and contact regions may have extended under the spacers to abut a sidewall of the corresponding transistor or capacitor gate.

The process continues to complete forming the device. The processing may include silicide block deposition and patterning to form a silicide block over the storage transistor and capacitor gates, forming metal silicide contacts to exposed terminals of the memory cell, forming an interlayer dielectric (ILD) layer, conductive contacts as well as one or more interconnect levels, final passivation, dicing, assembly and packaging. Other processes to complete forming the device may also be included. Other suitable process to form the device may also be useful.

Figure 7:
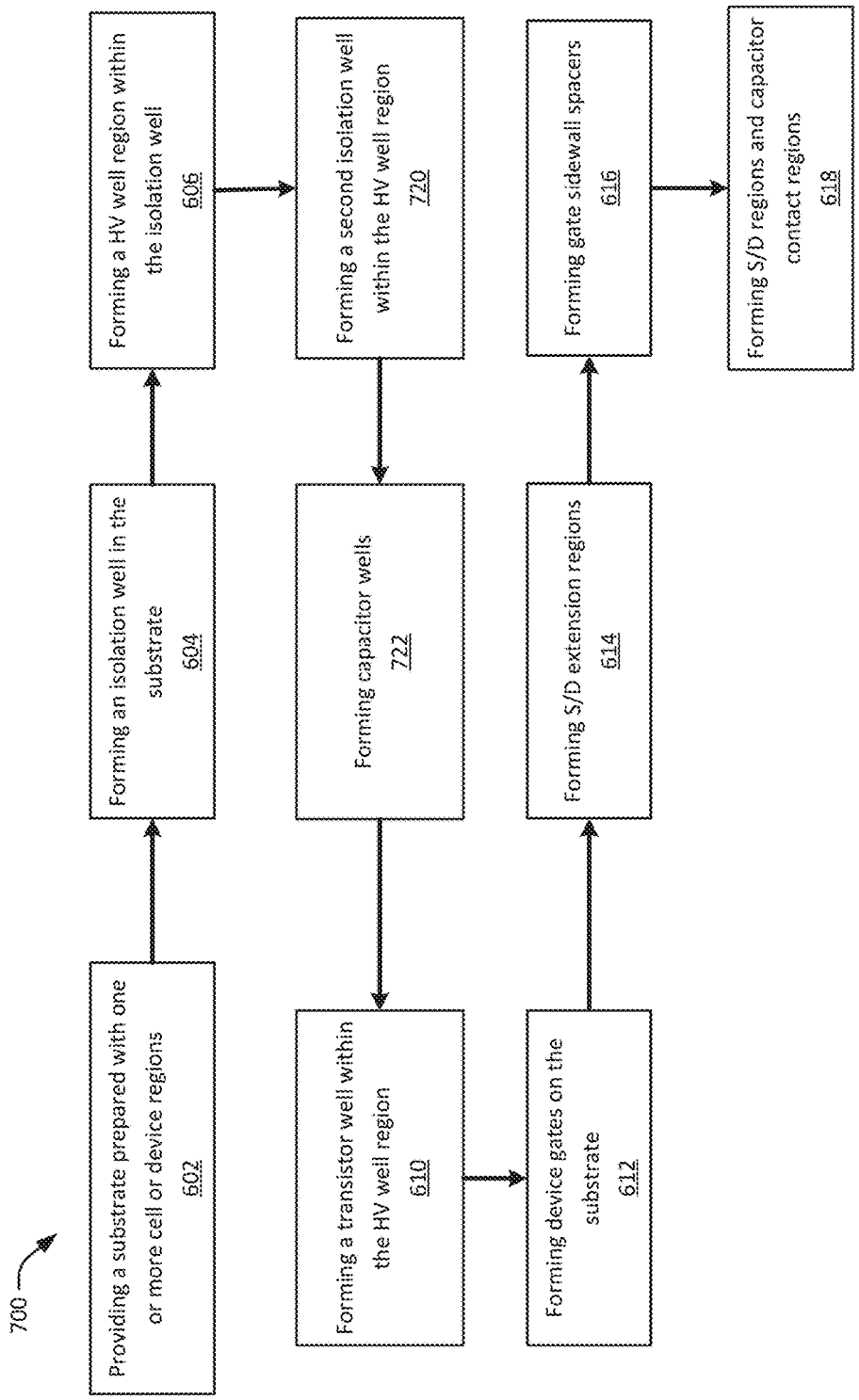
FIG. 7 shows a process for forming another embodiment of a memory cell.

FIG. 7 shows a process 700 for forming another embodiment of the memory cell described herein. In particular, process 700 illustrates an exemplary semiconductor manufacturing process flow to form the memory cell 400 described in FIGS. 4a-4c. In the interest of brevity, common elements having the same reference numerals may not be described or described in detail. The process 700 is similar to that described in FIG. 6. As such, the description of the process 700 below primarily focuses on the difference(s) compared with the process 600 described in FIG. 6.

At 720, a second isolation well is formed within the HV well region. The second isolation well may be a fourth well of the memory cell. The second isolation well, for example, is formed in the active control capacitor region within the HV well region. To form the second isolation well, an implant mask which selectively exposes the active control capacitor region is employed. Capacitor type dopants are implanted into the exposed substrate portion to form the second isolation well. For example, the implant mask is patterned to block the active transistor region and active erase capacitor region from the implant process. The dopants are implanted with the appropriate dose and power to form a second isolation well having the desired depth and dopant concentration. Other techniques for forming the second isolation well may also be useful. The second isolation well serves to improve isolation between the transistor well and control well which will be subsequently formed. The second isolation well may be a lightly doped well. For example, the second isolation well is sufficiently doped or configured as a HV device well. In one embodiment, the second isolation well may be simultaneously formed with first polarity type HV device wells for HV devices or transistors on the same substrate.

At 722, capacitor wells are formed. For example, erase and control wells are formed in active capacitor regions within the substrate. In one embodiment, the erase well is formed within the HV well region and the control well is formed within the second isolation well. To form the capacitor wells, an implant mask which selectively exposes the active capacitor regions is employed. Capacitor type dopants are implanted into the exposed substrate portions to form the capacitor wells. For example, the implant mask is patterned to block the active transistor region from receiving capacitor type dopants. In one embodiment, an implant process implants capacitor type dopants to form the control and erase wells simultaneously. For example, first polarity type dopants are implanted to the exposed capacitor regions to form the capacitor wells. The dopants are implanted with the appropriate dose and power to form capacitor wells having the desired depth and dopant concentration. The control and erase wells are, in one embodiment, implanted to about equal depths and with about equal dopant concentrations. Other techniques for forming the capacitor wells may also be useful. The control well may be referred to as a first capacitor well and the erase well may be referred to as a second capacitor well. The first and second capacitor wells may be lightly doped wells. For example, the capacitor wells are sufficiently doped or configured as LV device wells. Other configurations of capacitors wells may also be useful. In one embodiment, the capacitor wells may be simultaneously formed with first polarity type LV device wells for LV devices or transistors on the same substrate.

Although the various wells, as described in FIGS. 6 and 7, are formed in a specific implant sequence, it is understood that other implant sequences may be used. Furthermore, it is understood that other device wells may be formed on the substrate, depending on the type of device. The processes as described in FIGS. 6 and 7 result in advantages. For example, the processes 600 and 700 are highly compatible with CMOS processing. The processes as described may be integrated into CMOS processing with no new or additional mask required. Thus, a simplified and cost-free MTP memory cell together with CMOS devices can be achieved.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory device comprising:
   a substrate; and
   a single transistor multi time programmable (MTP) memory cell, wherein the single transistor MTP memory cell comprises
   a transistor well and first and second capacitor wells disposed in the substrate,
      a transistor having a floating gate disposed over the transistor well, the transistor comprising first and second source/drain (S/D) regions disposed adjacent to sides of the floating gate,
      a control capacitor comprising a control gate disposed over the first capacitor well, wherein the control gate is coupled to the floating gate,
      an erase capacitor comprising an erase gate disposed over the second capacitor well, wherein the erase gate is coupled to the floating gate, and
      wherein the first capacitor well comprises a first dopant concentration and the second capacitor well comprises a second dopant concentration about equal to the first dopant concentration, wherein the transistor well comprises a third dopant concentration which is different from each of the first and second dopant concentrations.

2. The memory device of claim 1 wherein the transistor well is configured as a medium voltage (MV) device well, and the first and second capacitor wells are configured as high voltage (HV) device wells.

3. The memory device of claim 1 wherein the third dopant concentration is higher than each of the first and second dopant concentrations.

4. The memory device of claim 1 wherein the transistor well is configured as a medium voltage (MV) device well, and the first and second capacitor wells are configured as low voltage (LV) device wells.

5. The memory device of claim 1 wherein the third dopant concentration is lower than each of the first and second dopant concentrations.

6. The memory device of claim 1 wherein the first and second capacitor wells comprise a first polarity type dopant and the transistor well comprises a second polarity type dopant different from the first polarity type dopant.

7. The memory device of claim 1 comprising a silicide block wrapped around a top surface and sidewalls of the floating gate, wherein the silicide block extends to contact top surfaces and sidewalls of the erase gate and the control gate.

8. The memory device of claim 1 comprising a cell isolation region disposed in the substrate, wherein the erase gate partially overlaps the cell isolation region.

9. The memory device of claim 1 wherein the first S/D region of the transistor comprises a lightly doped drain (LDD) region while the second S/D region of the transistor is devoid of a LDD region.

10. A method for forming a memory device comprising:
    providing a substrate;
    forming a first capacitor well having a first dopant concentration within the substrate;
    forming a second capacitor well having a second dopant concentration within the substrate, wherein the second dopant concentration is about equal to the first dopant concentration;

forming a transistor well having a third dopant concentration within the substrate, wherein the third dopant concentration is different from each of the first and second dopant concentrations; and forming a single transistor multi time programmable (MTP) memory cell, wherein forming the single transistor MTP memory cell comprises
- forming a transistor having a floating gate over the transistor well, wherein first and second source/drain (S/D) regions are formed adjacent to first and second sides of the floating gate,
- forming a control capacitor, the control capacitor comprising a control gate disposed over the first capacitor well, wherein the control gate is coupled to the floating gate,
- forming an erase capacitor, the erase capacitor comprising an erase gate disposed over the second capacitor well, wherein the erase gate is coupled to the floating gate, and
- wherein the first and second capacitor wells comprise first polarity type dopants, wherein the transistor well comprises second polarity type dopants different from the first polarity type dopants.

11. The method of claim 10 comprising forming a device isolation region in the substrate, wherein the erase gate partially overlaps the device isolation region.

12. The method of claim 10 wherein the transistor well is configured as a medium voltage (MV) device well, and the first and second capacitor wells are configured as low voltage (LV) device wells.

13. The method of claim 10 wherein the transistor well is configured as a medium voltage (MV) device well and the first and second capacitor wells are configured as high voltage (HV) device wells.

14. The method of claim 10 comprising forming a silicide block over the transistor well and the first and second capacitor wells, wherein the silicide block wraps around a top surface and sidewalls of the floating gate and partially overlaps the first and second S/D regions.

15. The method of claim 14 wherein the silicide block extends to wrap around a top surface and sidewalls of the erase gate.

16. The method of claim 15 wherein the silicide block extends to wrap around a top surface and sidewalls of the control gate.

17. A non-volatile multi-time programmable memory cell comprising:
- a substrate;
- a transistor well and first and second capacitor wells disposed in the substrate;
- a transistor having a floating gate and disposed over the transistor well, the transistor comprising first and second source/drain (S/D) regions disposed adjacent to sides of the floating gate;
- a control capacitor comprising a control gate, wherein the control gate is disposed over the first capacitor well, wherein the control gate is coupled to the floating gate;
- an erase capacitor comprising an erase gate, wherein the erase gate is disposed over the second capacitor well, wherein the erase gate is coupled to the floating gate; and
- wherein each of the first and second capacitor wells comprises a higher dopant concentration relative to a dopant concentration of the transistor well.

18. The non-volatile multi-time programmable memory cell of claim 17 wherein the transistor well is configured as a medium voltage (MV) device well, and the first and second capacitor wells are configured as low voltage (LV) device wells.

19. The non-volatile multi-time programmable memory cell of claim 17 comprising a silicide block wrapped around a top surface and sidewalls of the floating gate, wherein the silicide block extends to wrap around a top surface and sidewalls of the erase gate.

20. The non-volatile multi-time programmable memory cell of claim 17 comprising a silicide block disposed over the substrate, wherein the silicide block overlaps the transistor well and the first and second capacitor wells.

* * * * *